United States Patent [19]
Eul

[11] Patent Number: 5,822,688
[45] Date of Patent: Oct. 13, 1998

[54] METHOD FOR ENHANCING THE RECEPTION SENSITIVITY IN HOMODYNE RECIEVERS

[75] Inventor: Hermann-Josef Eul, Oberschleissheim, Germany

[73] Assignee: Siemens Aktienesellschaft, Munich, Germany

[21] Appl. No.: 683,760

[22] Filed: Jul. 17, 1996

[30] Foreign Application Priority Data

Jul. 18, 1995 [DE] Germany ................ 195 26 170.4

[51] Int. Cl.[6] ...................................... H04B 1/26
[52] U.S. Cl. .................. 455/318; 455/293; 455/303; 455/310; 455/311; 455/276.1; 455/324; 455/326
[58] Field of Search ....................... 455/318, 254, 455/255, 256, 276.1, 293, 303, 307, 310, 311, 313, 324, 326

[56] References Cited

U.S. PATENT DOCUMENTS

| | | | |
|---|---|---|---|
| 4,682,117 | 7/1987 | Gibson | 455/214 |
| 4,750,215 | 6/1988 | Biggs | 455/226 |
| 4,903,331 | 2/1990 | Kasperkovitz | 455/207 |
| 5,355,533 | 10/1994 | Dickerson | 455/306 |
| 5,371,902 | 12/1994 | Marz | 455/304 |
| 5,398,002 | 3/1995 | Bang | 329/302 |
| 5,530,929 | 6/1996 | Lindqvist et al. | 455/324 |

FOREIGN PATENT DOCUMENTS

| | | |
|---|---|---|
| 0 305 602 A1 | 3/1989 | European Pat. Off. . |
| 0 647 016 A1 | 4/1995 | European Pat. Off. . |
| 37 84 930 T2 | 3/1993 | Germany . |
| 2 282 925 | 4/1995 | United Kingdom . |
| WO 93/14578 | 7/1993 | WIPO . |

OTHER PUBLICATIONS

H.J. Eul et al, Etablierung der Komplexen Messfaehigkeit Eines Homodynen Reflektomers Durch Unbekannte Standards Mit Hilfe Der Moebius–Transformation, vol. 33, pp. 1–12. Jan. 1989.

*Primary Examiner*—Donnie L. Crosland
*Attorney, Agent, or Firm*—Hill & Simpson

[57] ABSTRACT

In a homodyne receiver for the reception of a carrier frequency signal modulated with a low-frequency signal, the sensitivity of the detection of the low-frequency signal is enhanced by two auxiliary modulations before the conversion into the base band. The auxiliary signal utilized for an auxiliary modulation of the local oscillator signal and the supplemental signal employed for an auxiliary modulation of the carrier frequency signal comprise frequencies that can be technologically governed and with economic outlay and enable the simple decoupling of the low-frequency signal from the supplemental signal and, thus, an enhancement of the sensitivity of the homodyne receiver. The decoupling is particularly achieved by a band-pass filtering after the conversion of the carrier frequency signal into the base band, this band-pass filtering being tuned to a specific frequency relationship of the auxiliary signal and the supplemental signal. An advantage of the homodyne receiver is of particular economic significance for employment in mass-produced articles, such as in mobile and wireless communication systems.

12 Claims, 2 Drawing Sheets

METHOD FOR ENHANCING THE RECEPTION SENSITIVITY IN HOMODYNE RECIEVERS

BACKGROUND OF THE INVENTION

What is generally understood as homodyne receivers is the part of a radio receiver wherein a received carrier frequency signal modulated with a low-frequency signal is converted into an intermediate frequency signal whose intermediate frequency is equal to zero. It is converted by mixing with a suitably selected oscillator signal. The low-frequency signal contained in the carrier frequency signal is thus directly available for further evaluation in following devices in the radio receiver. For example, this evaluation is comprised in the sampling and recovery of the low-frequency signal.

The low-frequency signal can only be evaluated according to one component, usually the part of the received signal that is in-phase with a local oscillator, or according to the in-phase and the quadrature component in the homodyne receiver. Such homodyne receivers are well-known, for example from Meinke, Grundlach, Taschenbuch der Hochfrequenztechnik, Vol. 3, Springer Verlag, pp.Q4–Q8. An oscillator signal that has a frequency corresponding to the carrier frequency of the received carrier frequency signal must be locally generated in the homodyne receiver for generating an intermediate frequency signal having the frequency zero.

There is also the possibility of modulating the carrier frequency signal even before the mixing with an auxiliary signal and of band-pass filtering the mixed result after the mixing. This arrangement makes it possible to compensate the d.c. voltage part via the band-pass filtering. The signal to be detected is thus systematically separated from the d.c. voltage part that is dependent on temperature, level and unit and that can otherwise only be eliminated with difficulty given homodyne receivers. Compared to the IF-filters of a homodyne receiver, the band-pass filters are simple to realize since they are provided for substantially lower frequencies.

Given this realization, however, the sensitivity of the homodyne receiver is highly dependent on the decoupling of the auxiliary signal employed for the auxiliary modulation of the carrier frequency signal from the low-frequency signal. A high-level auxiliary signal having square-wave shape is usually employed in order to efficiently operate the modulator. This auxiliary signal must be decoupled from the detection channel, this being technically difficult and only obtainable given economically high outlay.

SUMMARY OF THE INVENTION

It is an object of the present invention to provide a method for enhancing the reception sensitivity in homodyne receivers by simple and economic means.

In general terms the present invention is a method for enhancing the reception sensitivity in homodyne receivers. A received carrier frequency signal modulated with a low-frequency signal is mixed with an oscillator signal that can be allocated to the carrier frequency and that is derived from a local oscillator signal to form a first intermediate frequency signal. The carrier frequency signal is modulated with a supplemental signal before the mixing. The oscillator signal is formed by modulation of the local oscillator signal with an auxiliary signal. A band-pass filtering of the first intermediate frequency signal is tuned to a frequency derived from the frequency of the auxiliary signal and of the supplemental signal.

Advantageous developments of the present invention are as follows.

Additionally, the carrier frequency signal is mixed with the oscillator signal that can be allocated to the carrier frequency and that is phase-shifted by 90° to form a second intermediate frequency signal. A band filtering of the second intermediate frequency signal is tuned to the frequency derived from the frequency of the auxiliary signal and of the supplemental signal.

The band filtering of the at least one intermediate frequency signal is respectively tuned to the frequency difference between the frequencies of the supplemental signal and of the auxiliary signal.

The frequencies of the auxiliary signal and of the supplemental signal lying between the frequencies of the low-frequency signal and of the carrier frequency signal are respectively tuned to a frequency at which economically realizable switchovers and band filters can be utilized.

The frequency of the auxiliary signal and of the supplemental signal are selected such that the frequency difference between auxiliary signal and supplemental signal is lower than the frequency of the supplemental signal and the frequency of the auxiliary signal. The frequency difference does not correspond to any other employed frequency of a reception means comprising the homodyne receiver.

In general terms the present invention is also a homodyne receiver for enhancing the sensitivity in the reception of a carrier frequency signal modulated with a low-frequency signal. The receiver has two mixer stages that have their input side respectively connected to an additional modulator belonging to the homodyne radio receiver. The mixer stages are supplied with an oscillator signal either directly or, respectively, via a 90° phase shifter. The input of the homodyne radio receiver carrying the carrier frequency signal corresponds to the input of the additional modulator in which the carrier frequency signal is modulated with a supplemental signal before the mixing in the mixer stages. The carrier frequency signal is mixed in the first mixer stage with an oscillator signal allocatable to the respective carrier frequency and, thus, a local oscillator signal generated in a local oscillator. It is mixed in the second mixer stage with the oscillator signal shifted by 90° in the 90° phase shifter to respectively form a first or, respectively, second intermediate frequency signal pending at the respective output of the first and second mixer stage. An output of the first mixer stage is connected to an input of a first band-pass filter and an output of the second mixer stage is connected to an input of a second band-pass filter. The local oscillator signal of the local oscillator connected to the input of the modulator is modulated with an auxiliary signal in a modulator to form the oscillator signal. The band-pass filters are respectively tuned corresponding to a frequency derived from the frequency of the auxiliary signal and of the supplemental signal such that a first output signal proportional to the real part of the low-frequency signal pends at the output of the first band-pass filter and a second output signal proportional to the imaginary part of the low-frequency signal pends at the output of the second band-pass filter.

The band-pass filters for the band-filtering of the first and second intermediate frequency signal are tuned to the frequency difference between the frequencies of the supplemental signal and of the auxiliary signal.

The frequencies of the auxiliary signal and of the supplemental signal between the frequencies of the low-frequency signal and of the carrier frequency signal are defined in a frequency range of modulators and band-pass filters that can be simply and cost-beneficially realized.

The frequencies of the auxiliary signal and of the supplemental signal are selected such that the level of the frequency difference is lower than the frequency of the supplemental signal and the frequency of the auxiliary signal. The difference does not correspond to any other employed frequency of a reception means comprising the homodyne receiver.

An important aspect of the present invention is an application of an additional auxiliary signal that can be formed and used technologically simply and with little economic outlay. Before the mixing, the local oscillator signal is modulated with the auxiliary signal to form an oscillator signal. By a band-pass filtering after the mixing of the likewise modulated carrier frequency signal with the oscillator signal, the received low-frequency signal is separated from noise components as amplitude of an alternating voltage signal. Given suitable selection of the frequencies of the supplemental signal and of the auxiliary signal, this two-fold auxiliary modulation creates the possibility of assuring the decoupling of the first auxiliary modulation of the carrier frequency signal from the detection channel without high technical demands.

Advantageously, the received low-frequency signal is completely evaluated, i.e. both according to in-phase components as well as according to quadrature components, to which end the carrier frequency signal is additional mixed with the 90° phase-shifted oscillator signal allocatable to the current carrier frequency to form a second intermediate frequency signal, and is band-pass filtered corresponding to a frequency derived from the frequency of the auxiliary signal and of the supplemental signal.

In the simplest realization of the inventive method, the separation of the received, low-frequency signal from further undesired frequency parts can thus be realized with a single economically and simply realized band-pass filter. A single signal is thus selected by the band-pass filtering from the plurality of signals comprising different frequencies that are available after the mixing. A highly sensitive receiver can be designed by suitable selection of said frequencies since the frequency of the filtered signal is completely independent of the other frequencies employed in the reception means and is not subject to any disturbing influences. The inventive method achieves an effective separation of the received low-frequency signal from other signals contained in the mixed product, and a compensation of the d.c. voltage part is achieved, as a result whereof the reception sensitivity of the homodyne receiver is enhanced.

The frequencies of the auxiliary signal and of the supplemental signal can thereby lie between the frequencies of the low-frequency signal and the carrier frequency signal, so that economically realizable modulators and band-pass filters can be utilized for these frequencies.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
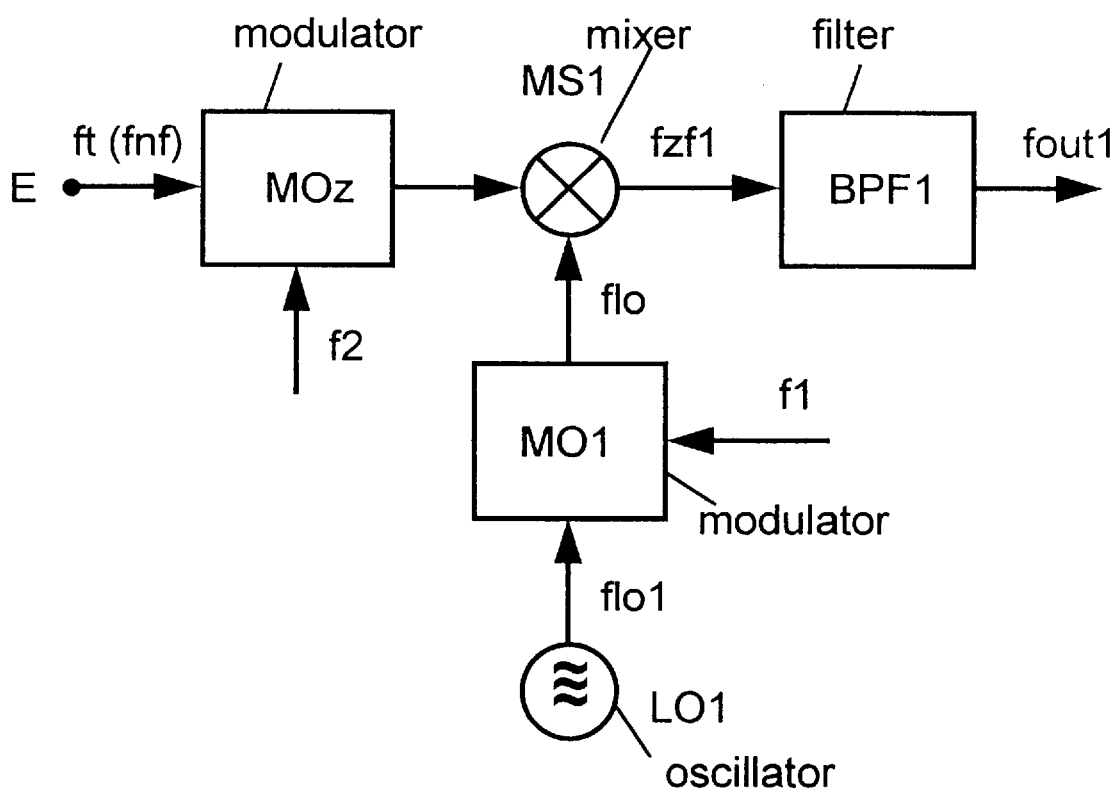
FIG. 1 is a block circuit diagram of a homodyne receiver with two-fold auxiliary modulation for the reception of a carrier frequency signal.
Figure 2:
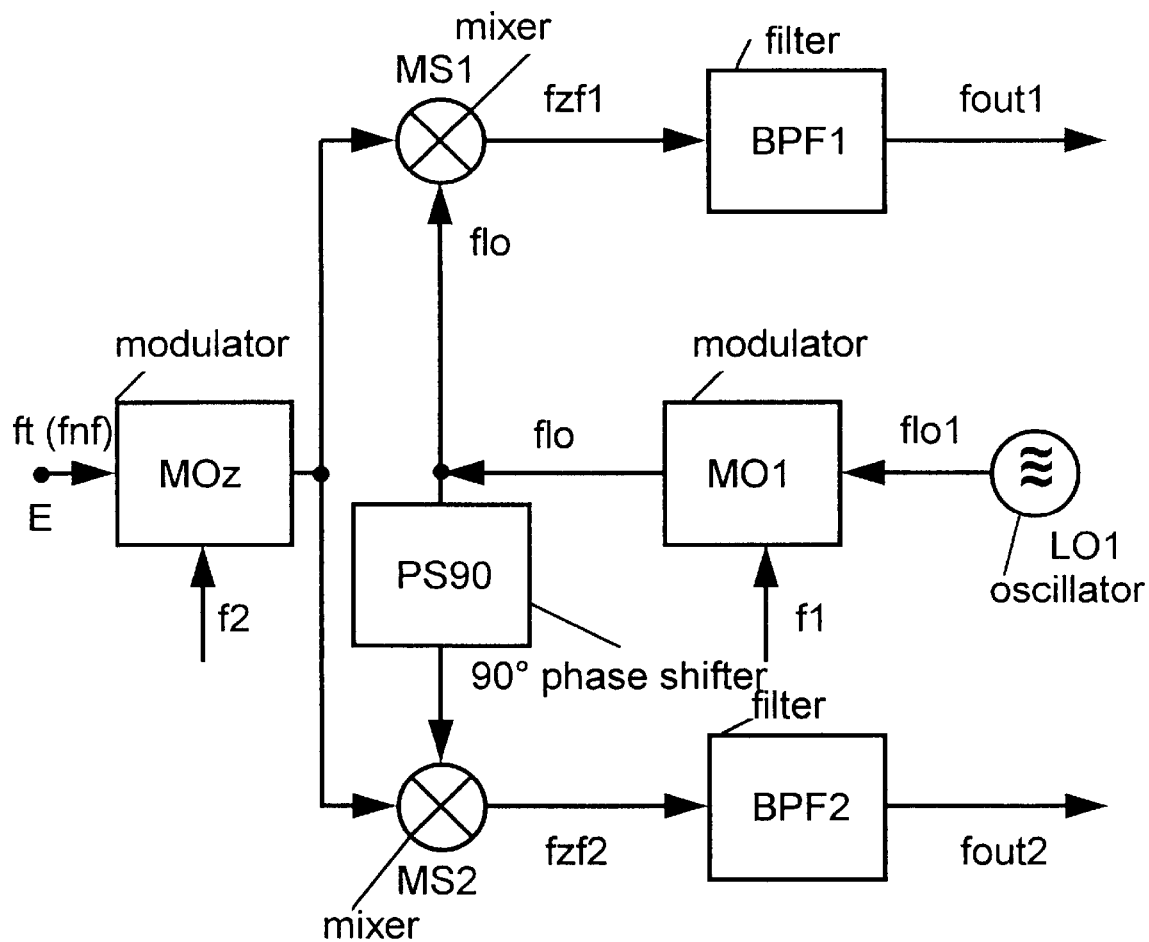
FIG. 2 is a block circuit diagram of a homodyne receiver with two-fold auxiliary modulation for the reception of the in-phase and quadrature components of a carrier frequency signal.

The homodyne receivers shown in FIGS. 1 through 2 serve for the reception of a carrier frequency signal ft modulated with a low-frequency signal fnf and for the conversion thereof into the base band. For example, the homodyne receiver thereby forms a part of a reception means that, as radio receiver, has further devices (not shown) for the reception of the high-frequency carrier frequency signals with an antenna and including a forwarding or relaying of the low-frequency signal fnf.

Given the homodyne receiver according to FIG. 1, a first local oscillator LO1 is connected to a first modulator MO1 and supplies the latter with a local oscillator signal flo1. The frequency of the local oscillator signal flo1 corresponds to the carrier frequency of the carrier frequency signal ft. An auxiliary signal f1 that is lower in frequency compared to the local oscillator signal flo1 is supplied to the modulator MO1. The output of the modulator MO1 carries the modulation result of the modulator MO1, the first oscillator signal flo.

The oscillator signal flo is supplied to an input of a first mixer stage MS1. A second input of the first mixer stage MS1 is connected to an output of an additional modulator MOz. An input E of the homodyne receiver that carries the carrier frequency signal ft forms an input of the additional modulator MOz. Since the supplemental signal f2 as well as the auxiliary signal f1 has significantly lower frequencies and frequencies that can also be technologically governed with lower outlay compared to high frequencies, the two-fold auxiliary modulation does not cause any significant added economic outlay. For example, this carrier frequency signal ft is the pre-amplified input signal of the receiver means and contains the low-frequency signal fnf modulated on the carrier frequency signal ft, for example, a voice signal in a telephone application of the homodyne receiver. The modulation method according to which the low-frequency signal fnf is modulated onto the carrier frequency signal ft is of no consequence for the functioning of the homodyne receiver. For example, phase modulation is a standard modulation method for mobile radiotelephone applications.

A first intermediate frequency signal fzf1 pends at the output of the first mixer stage MS1 as the result of the mixing event in the first mixer stage MS1. Since the frequency of the first local oscillator signal flo1 and the carrier frequency of the carrier frequency signal ft are identical, a conversion of the input signal into the base band is present.

The output of the first mixer stage MS1 is connected to the input of a first band-pass filter BPF1. The first intermediate frequency signal fzf1 is band-pass filtered in the first band-pass filter BPF1, whereby the first band-pass filter BPF1 is tuned to a frequency that is derived from the frequency of the auxiliary signal f1 and the frequency of the supplemental signal f2. The first output signal fout1 present at an output of the first band-pass filter BPF1 thus contains no frequency parts that derive from the local oscillator signal flo1. After the mixing and band-pass filtering, the alternating voltage amplitude of the first output signal fout1 is proportional to the in-phase component of the low-frequency signal fnf and is available as information in the first intermediate frequency signal fzf1.

Among other things, consequently, a signal with a frequency is available that corresponds to the amount of the frequency difference f3 between the supplemental signal f2 and the auxiliary signal f1. The first band-pass filter BPF1 is tuned to this frequency. A substantial enhancement of the sensitivity of the homodyne receiver can be achieved when the frequencies of the auxiliary signal f1 and the supplemental signal f2 are predetermined such that the frequency difference f3 does not correspond to any other frequency parts employed in the homodyne receiver or other devices of the reception means. When the frequency difference f3 is lower than the frequency of the auxiliary signal f1 and that of the supplemental signal f2, internal disturbances due to harmonics of the mixed signals are also eliminated. All frequency parts of the intermediate frequency signal fzf1 that do not represent the frequency difference f3 are suppressed by the band-pass filtering and all d.c. voltage parts are additionally removed. A compensation of the offset is consequently also achieved.

The first output signal fout1 of the homodyne receiver provides a largely noise-free signal to further components (not shown) of the receiver circuit for sampling and evaluation. When the further evaluation of the first output signal fout1 is a matter of digital selection filters and other digital assemblies, the demands made of the first band-pass filter with respect to satisfying the anti-aliasing condition can be reduced.

Due to its substantially more cost-beneficial realization, the inventive homodyne receiver is suitable for mass-production applications such as mobile and base stations in wireless and mobile communication networks.

The homodyne receiver in FIG. 2 represents an expansion of the reception principle explained in FIG. 1 for the reception of a quadrature component in addition to the in-phase component. The oscillator signal flo is generated in the way set forth above and, in addition to being supplied to the first mixer stage MS1, is also supplied to a 90° phase shifter PS90 that is likewise connected to the modulator MO1. The phase of the oscillator signal flo is turned by 90° in the 90° phase shifter PS90, and the oscillator signal flo modulated in this way is supplied to a second mixer stage MS2. A further input of the second mixer stage MS2 is connected to the output of the additional modulator MOz, so that the second intermediate frequency signal fzf2 pends at the output of the second mixer stage MS2.

The output of the second mixer stage MS2 is connected to an input of a second band-pass filter BPF2. Like the first band-pass filter BPF1, this second band-pass filter BPF2 is tuned to the frequency difference f3. After the band filtering of the second intermediate frequency signal fzf2, consequently, the second band-pass filter BFP2 offers a second output signal fout2 at its output. The amplitude of this second output signal fout2 is proportional to the quadrature component of the low-frequency signal fnf. Like the first output signal fout1, this second output signal fout2 is also sampled and evaluated in further components of the receiver means. However, a complete information in terms of amplitude and phase about the low-frequency signal fnf is now available for the following evaluation with the two output signals fout1, fout2.

The invention is not limited to the particular details of the method and apparatus depicted and other modifications and applications are contemplated. Certain other changes may be made in the above described method and apparatus without departing from the true spirit and scope of the invention herein involved. It is intended, therefore, that the subject matter in the above depiction shall be interpreted as illustrative and not in a limiting sense.

What is claimed is:

1. A method for enhancing reception sensitivity in homodyne receivers, comprising the steps of:

receiving a carrier frequency signal in the homodyne receiver, the carrier frequency signal having a carrier frequency modulated with a low-frequency signal;

forming a first oscillator signal by modulation of a local oscillator signal with an auxiliary signal;

modulating the received carrier frequency signal with a supplemental signal;

mixing the received and modulated carrier frequency signal with the first oscillator signal, that is allocatable to the carrier frequency and that is derived from the local oscillator, to form a first intermediate frequency signal;

tuning a band-pass filtering of the first intermediate frequency signal to a frequency derived from the frequency of the auxiliary signal and the frequency of the supplemental signal.

2. The method according to claim 1, wherein the method further comprises:

mixing the carrier frequency signal with the first oscillator signal that is allocatable to the carrier frequency and that is phase-shifted by 90° to form a second intermediate frequency signal; and tuning a band-pass filtering of the second intermediate frequency signal to a frequency derived from the frequency of the auxiliary signal and the frequency of the supplemental signal.

3. The method according to claim 1, wherein the method further comprises the filtering of the intermediate frequency signal to a frequency difference between the frequency of the supplemental signal and the frequency of the auxiliary signal.

4. The method according to claim 1, wherein the frequency of the auxiliary signal and the frequency of the supplemental signal, lying between the frequency of the low-frequency signal and the frequency of the carrier frequency signal, are respectively tuned to a frequency at which economically realizable switchovers and band filters can be utilized.

5. The method according to claim 1, wherein the frequency of the auxiliary signal and the frequency of the supplemental signal are selected such that a frequency difference between the auxiliary signal and the supplemental signal is lower than the frequency of the supplemental signal and the frequency of the auxiliary signal and corresponds to no further employed frequency of the homodyne receiver.

6. A homodyne receiver for enhancing sensitivity clearing reception of a carrier frequency signal modulated with a low-frequency signal, comprising:

first and second mixer stages having input sides respectively connected to a first modulator in the homodyne radio receiver and supplied with a first oscillator signal either directly or, respectively, via a 90° phase shifter;

an input of the homodyne radio receiver carrying the carrier frequency signal corresponding to an input of the first modulator in which the carrier frequency signal is modulated with a supplemental signal before mixing in the first and second mixer stages;

the carrier frequency signal being mixed in the first mixer stage with the first oscillator signal allocatable to the respective carrier frequency and to a local oscillator signal generated in a local oscillator, and the carrier frequency signal being mixed in the second mixer stage with the oscillator signal shifted by 90° in the 90° phase shifter to respectively form first and second intermediate frequency signals pending at respective outputs of the first and second mixer stages;

an output of the first mixer stage connected to an input of a first band-pass filter and an output of the second mixer stage is connected to an input of a second band-pass filter;

the local oscillator signal of the local oscillator, supplied to an input of a second modulator, being modulated with an auxiliary signal in the second modulator to form the oscillator signal; and band-pass filters respectively tuned to a frequency derived from the frequency of the auxiliary signal and the frequency of the supplemental signal such that a first output signal proportional to a real part of the low-frequency signal pends at an output of the first band-pass filter and a second output signal proportional to an imaginary part of the low-frequency signal pends at an output of the second band-pass filter.

7. The homodyne receiver according to claim 6, wherein the first and second band-pass filters for the band-pass filtering of the first and second intermediate frequency signal, respectively, are tuned to a frequency difference between the frequency of the supplemental signal and the frequency of the auxiliary signal.

8. The homodyne receiver according to claim 6, wherein the frequency of the auxiliary signal and the frequency of the supplemental signal, that are between the frequency of the low-frequency signal and the frequency of the carrier frequency signal, are defined in a frequency range of modulators and band-pass filters that are simply and cost-beneficially realizable.

9. The homodyne receiver according to claim 6, wherein the frequency of the auxiliary signal and the frequency of the supplemental signal are selected such that the frequency of the frequency difference is lower than the frequency of the supplemental signal and the frequency of the auxiliary signal, and wherein the frequency of the frequency difference corresponds to no other employed frequency of the homodyne receiver.

10. A method for enhancing reception sensitivity in homodyne receivers, receiving a carrier frequency signal in the homodyne receiver, the carrier frequency signal having a carrier frequency modulated with a low-frequency signal;

forming a first oscillator signal by modulation of a local oscillator signal with an auxiliary signal;

modulating the received carrier frequency signal with a supplemental signal;

mixing the received and modulated carrier frequency signal with the first oscillator signal, that is allocatable to the carrier frequency and that is derived from the local oscillator, to form a first intermediate frequency signal;

tuning a band-pass filtering of the first intermediate frequency signal to a frequency derived from the frequency of the auxiliary signal and the frequency of the supplemental signal;

mixing the received and modulated carrier frequency signal with the first oscillator signal, that is allocatable to the carrier frequency and that is phase-shifted by 90°, to form a second intermediate frequency signal; and tuning a band-pass filtering of the second intermediate frequency signal to a frequency derived from the frequency of the auxiliary signal and the frequency of the supplemental signal.

11. The method according to claim 10, wherein the frequency of the auxiliary signal and the frequency of the supplemental signal, lying between the frequency of the low-frequency signal and the frequency of the carrier frequency signal, are respectively tuned to a frequency at which economically realizable switchovers and band filters are realizable.

12. The method according to claim 10, wherein the frequency of the auxiliary signal and the frequency of the supplemental signal are selected such that a frequency difference between the auxiliary signal and the supplemental signal is lower than the frequency of the supplemental signal and the frequency of the auxiliary signal, and wherein the frequency of the frequency difference corresponds to no further employed frequency of the homodyne receiver.

* * * * *